United States Patent
Nee et al.

(10) Patent No.: US 9,710,007 B2
(45) Date of Patent: Jul. 18, 2017

(54) INTEGRATED CIRCUIT CAPABLE OF PROVIDING A STABLE REFERENCE CURRENT AND AN ELECTRONIC DEVICE WITH THE SAME

(71) Applicant: ALi Corporation, Hsinchu (TW)

(72) Inventors: Hsu-Che Nee, Hsinchu (TW); Liang-Hsin Chen, Hsinchu (TW); Yi-Hsien Cheng, Hsinchu (TW)

(73) Assignee: ALi Corporation, Hsinchu (TW)

( * ) Notice: Subject to any disclaimer, the term of this patent is extended or adjusted under 35 U.S.C. 154(b) by 0 days.

(21) Appl. No.: 14/930,202

(22) Filed: Nov. 2, 2015

(65) Prior Publication Data

US 2016/0306376 A1    Oct. 20, 2016

(30) Foreign Application Priority Data

Apr. 20, 2015 (CN) ............ 2015 1 0187238

(51) Int. Cl.
*G05F 3/24* (2006.01)
*G05F 3/26* (2006.01)
*H03G 1/00* (2006.01)
*H03F 1/30* (2006.01)
*H03G 3/12* (2006.01)

(52) U.S. Cl.
CPC ............ *G05F 3/245* (2013.01); *G05F 3/247* (2013.01); *G05F 3/262* (2013.01); *H03F 1/30* (2013.01); *H03G 1/0017* (2013.01); *H03G 3/12* (2013.01)

(58) Field of Classification Search
CPC ........ G05F 3/247; G05F 1/156; G05F 1/1567; H03G 1/0017; H03G 1/0029; H03G 3/001; H03G 3/12; H03G 3/301; H03G 3/3015; H03G 3/3026; H03F 2200/447; H03F 2200/45284; H03F 2200/45286; H03F 2200/528; H03F 2203/45284; H03F 2203/45286; H03F 2203/45456; H03F 1/30

See application file for complete search history.

(56) References Cited

U.S. PATENT DOCUMENTS

| | | | |
|---|---|---|---|
| 5,231,315 A | 7/1993 | Thelen, Jr. | |
| 5,231,316 A * | 7/1993 | Thelen, Jr. | H03F 1/301 327/103 |
| 5,805,022 A * | 9/1998 | Bruccoleri | G11B 5/02 330/138 |

(Continued)

FOREIGN PATENT DOCUMENTS

| | | |
|---|---|---|
| CN | 101339073 | 1/2009 |
| CN | 102118151 | 7/2011 |

OTHER PUBLICATIONS

"Office Action of China Counterpart Application," issued on Mar. 29, 2017, pp. 1-8, in which the listed references were cited.

*Primary Examiner* — Thomas J Hiltunen
(74) *Attorney, Agent, or Firm* — J.C. Patents

(57) ABSTRACT

An electronic device and an integrated circuit thereof are provided. The integrated circuit includes a voltage generator and a current generator with a negative temperature coefficient. The voltage generator generates a reference voltage proportional to an absolute temperature based on a predetermined value. The current generator with the negative temperature coefficient receives the reference voltage and generates a reference current based on the reference voltage.

16 Claims, 5 Drawing Sheets

(56) References Cited

U.S. PATENT DOCUMENTS

| | | | | |
|---|---|---|---|---|
| 5,896,064 A * | 4/1999 | Kaku | ............... | H03G 3/3042 |
| | | | | 330/129 |
| 6,459,326 B2 * | 10/2002 | Descombes | ............. | G05F 3/245 |
| | | | | 327/362 |
| 6,756,850 B2 * | 6/2004 | Matsushita | .......... | H03G 3/3042 |
| | | | | 330/285 |
| 7,064,602 B2 * | 6/2006 | Nguyen | ............. | H03F 3/45183 |
| | | | | 323/316 |
| 7,075,372 B2 * | 7/2006 | Juang | ................. | H03F 1/34 |
| | | | | 330/279 |
| 7,123,081 B2 * | 10/2006 | Lyon | ................. | G05F 3/262 |
| | | | | 327/103 |
| 7,535,397 B1 * | 5/2009 | Chiou | ................. | H03M 1/68 |
| | | | | 341/145 |
| 8,410,966 B2 * | 4/2013 | Nadimpalli | ............. | G05F 1/575 |
| | | | | 341/144 |
| 8,531,238 B2 * | 9/2013 | Killat | .................. | H03F 3/45183 |
| | | | | 327/124 |
| 8,604,826 B2 | 12/2013 | Cho et al. | | |
| 9,124,282 B1 * | 9/2015 | Gutta | .................. | H03M 1/0617 |
| 9,158,321 B2 * | 10/2015 | Ting | ..................... | G05F 1/561 |
| 2003/0001676 A1 | 1/2003 | Matsushita et al. | | |
| 2006/0061412 A1 * | 3/2006 | Molina | .................... | G05F 3/30 |
| | | | | 327/539 |
| 2009/0302825 A1 * | 12/2009 | Hsieh | .................... | G05F 3/24 |
| | | | | 323/315 |
| 2011/0298642 A1 * | 12/2011 | Nomasaki | ................. | G05F 3/26 |
| | | | | 341/121 |
| 2014/0118068 A1 * | 5/2014 | Kawasaki | ................ | H03F 1/30 |
| | | | | 330/279 |
| 2016/0126911 A1 * | 5/2016 | Kuan | .................. | H03G 3/3036 |
| | | | | 330/278 |

* cited by examiner

| Predetermined voltage | Predetermined data |
|---|---|
| VP1(2.8003) | DP1[0000] |
| VP2(2.8112) | DP2[0001] |
| VP3(2.8223) | DP3[0010] |
| VP4(2.8335) | DP4[0011] |
| VP5(2.8449) | DP5[0100] |
| VP6(2.8564) | DP6[0101] |
| VP7(2.8682) | DP7[0110] |
| VP8(2.8801) | DP8[0111] |
| VP9(2.892) | DP9[1000] |
| VP10(2.9044) | DP10[1001] |
| VP11(2.9171) | DP11[1010] |
| VP12(2.9301) | DP12[1011] |
| VP13(2.9435) | DP13[1100] |
| VP14(2.9574) | DP14[1101] |
| VP15(2.9719) | DP15[1110] |
| VP16(2.9732) | DP16[1111] |

INTEGRATED CIRCUIT CAPABLE OF PROVIDING A STABLE REFERENCE CURRENT AND AN ELECTRONIC DEVICE WITH THE SAME

CROSS-REFERENCE TO RELATED APPLICATION

This application claims the priority benefit of China application serial no. 201510187238.4, filed on Apr. 20, 2015. The entirety of the above-mentioned patent application is hereby incorporated by reference herein and made a part of this specification.

BACKGROUND

Field of the Invention

The invention relates to an electronic device and an integrated circuit thereof and more particularly, to an electronic device and an integrated circuit thereof that can contribute to reduce influence caused by process, temperature and voltage drifts.

Description of Related Art

An electronic device in many circumstances needs a stable reference current to ensure performance in operation. The electronic device may generate a reference current through an integrated circuit (IC), and the reference current must be capable of resisting influence caused by ambient factors (e.g., voltages and temperatures), so as to ensure accuracy of the reference current. Generally speaking, a conventional integrated circuit commonly generates a reference voltage by using a bandgap reference circuit and is connected with an external resistor through a pin. Thereby, the integrated circuit can generate a stable reference current based on the reference voltage generated by the bandgap reference circuit and the external resistor.

However, the aforementioned method usually leads the integrated circuit to consuming a great layout area for disposing the bandgap reference circuit and consuming an additional pin for connecting the external resistor. External noise may also be coupled to the pin for connecting the external resistor, which affects output quality of the reference current.

SUMMARY

The invention provides an electronic device and an integrated circuit thereof utilize a reference voltage proportional to an absolute temperature and have an impedance element with a positive temperature coefficient to generate a reference current. Thereby, not only the reference current with stability can be provided through the integrated circuit, but also a layout area of the integrated circuit can be reduced.

According to an embodiment of the invention, an integrated circuit including a voltage generator and a current generator with a negative temperature coefficient is provided. The voltage generator generates a reference voltage proportional to an absolute temperature based on a predetermined value. The current generator with the negative temperature coefficient receives the reference voltage and generates a reference current based on the reference voltage.

In an embodiment of the invention, the integrated circuit calibrates the reference current by using trimming data.

According to an embodiment of the invention, an electronic device including an integrated circuit and a data transmission interface is provided. The integrated circuit includes a voltage generator and a current generator with a negative temperature coefficient. The voltage generator generates a reference voltage proportional to an absolute temperature based on a predetermined value. The current generator with the negative temperature coefficient receives the reference voltage and generates a reference current based on the reference voltage. The data transmission interface generates an output voltage by using the reference current. The integrated circuit calibrates the reference current by using trimming data, such that the output voltage of the data transmission interface is adjusted to a basis voltage in response to calibration of the reference current.

To sum up, the current generator of the integrated circuit of the invention generates a current based on a predetermined voltage value, where a level of the current does not drift with temperature change and voltage variation. Thereby, not only the reference current with stability can be provided through the integrated circuit, but also a layout area of the integrated circuit can be reduced, which can contribute to development of miniaturization of the electronic device.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2B schematically illustrates a look-up table according to an embodiment of the invention.

DESCRIPTION OF EMBODIMENTS

Figure 1:
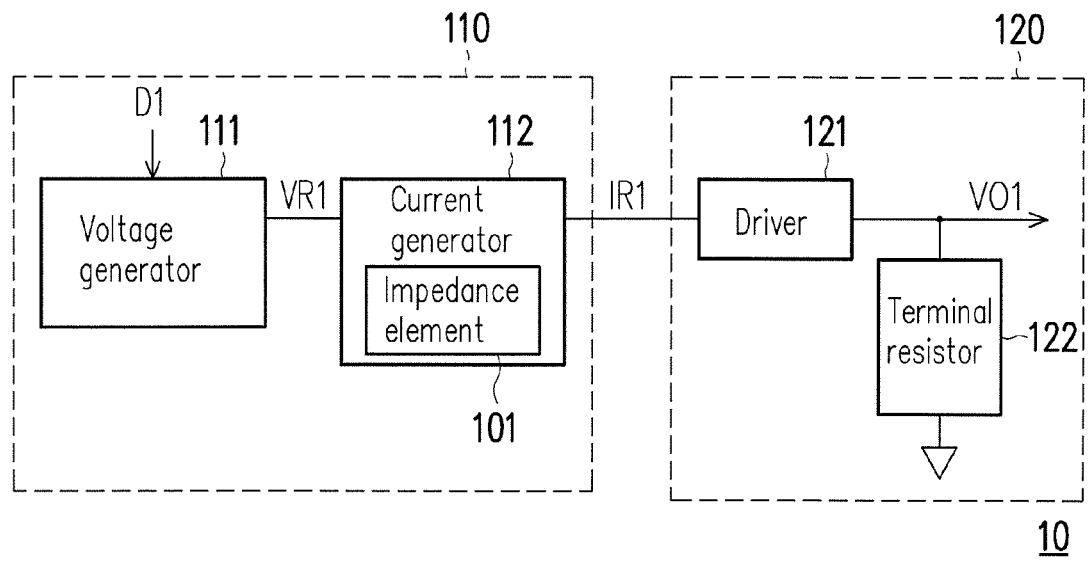
FIG. 1 is a schematic diagram illustrating an electronic device according to an embodiment of the invention.

FIG. 1 is a schematic diagram illustrating an electronic device according to an embodiment of the invention. Referring to FIG. 1, an electronic device 10 includes an integrated circuit 110 and a data transmission interface 120. The integrated circuit 110 provides a reference current IR1, and the data transmission interface 120 generates an output voltage VO1 based on the reference current IR1. In an embodiment, the data transmission interface 120 may be, for example, a serializer/deserializer (SERDES) and includes a driver 121 and a terminal resistor 122. The driver 121 is coupled to a current generator 112. The terminal resistor 122 is coupled to the driver 121 and a voltage. The voltage aforementioned provides a reference potential and may be, for example, a power voltage or a ground voltage. In operation, the driver 121 generates a driving current in response to the reference current IR1 and a differential input signal, and the terminal resistor 122 generates an output voltage VO1 according to the driving current.

Furthermore, the integrated circuit 110 includes a voltage generator 111 and the current generator 112. The voltage generator 111 generates a reference voltage VR1 based on a predetermined value (which is not shown), and variation of the reference voltage VR1 with temperature change is proportional to an absolute temperature. In an embodiment, the current generator 112 has an impedance element 101 with a positive temperature coefficient, so that the temperature coefficient of the current generator 112 is negative. In an embodiment, the current generator 112 receives the reference voltage VR1 and generates the reference current IR1 flowing through the impedance element 101 based on the reference voltage VR1. It should be noted that in an embodiment, the current generator 112 converts the reference voltage VR1 into the reference current IR1 by using the impedance element 101 with the positive temperature coefficient. Thus, the reference current IR1 does not change with variations of the temperature and the voltage. Namely, the current generator 112 may generate the reference current IR1 that is independent of temperature and voltage variations.

In addition, the integrated circuit 110 also calibrates the reference current IR1 through trimming data D1, such that the output voltage VO1 of the data transmission interface 120 is adjusted to a basis voltage in response to the calibration of the reference current IR1. For instance, the integrated circuit 110 may control the voltage generator 111 based on the trimming data D1. Thereby, the voltage generator 111 may adjust the reference voltage VR1 according to the trimming data D1, so as to achieve the calibration of the reference current IR1. In other words, the integrated circuit 110 may further eliminate influence caused to the reference current IR1 by process variation though the trimming data D1, so as to generate the reference current IR1 that is independent of process, voltage and temperature (PVT) variations.

In comparison with the related art, the integrated circuit 110 does not have be equipped with a bandgap reference circuit and may generate a stable reference current, without the need of an additional pin for connecting with an external resistor. In this way, a layout area of the integrated circuit 110 can be effectively reduced, which contributes to not only development of miniaturization of the electronic device 10, but also preventing the integrated circuit 110 from the influence caused by the external noise, so as to improve stability of the reference current IR1.

Figure 2A:
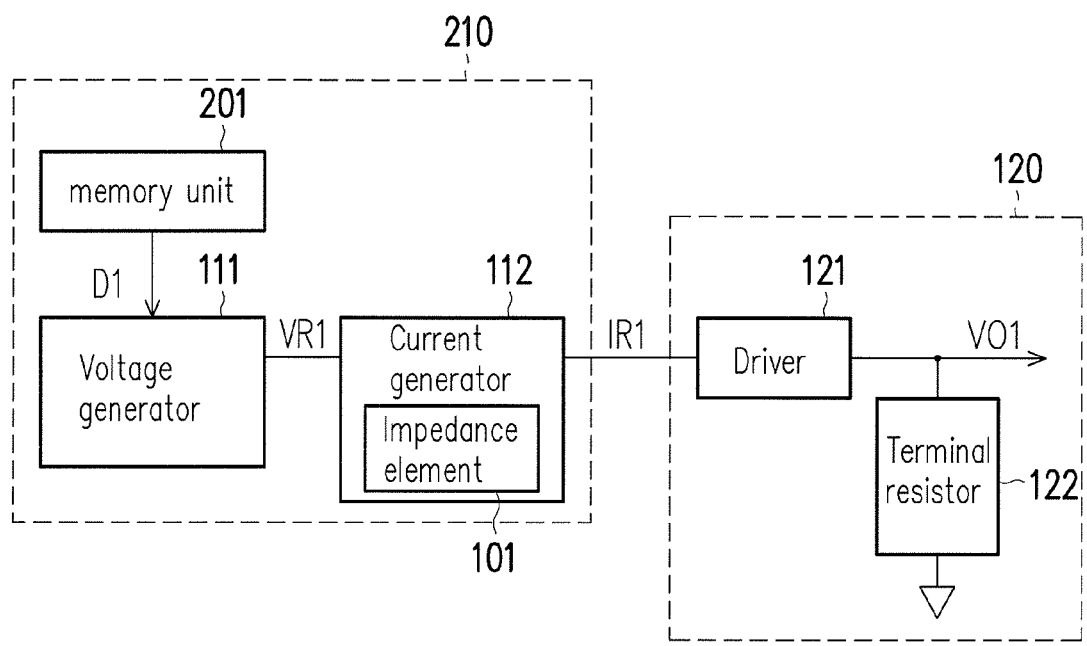
FIG. 2A is a schematic diagram illustrating an electronic device according to another embodiment of the invention.

It is to be mentioned that the integrated circuit 110 may generates the trimming data D1 by looking up a table. For instance, FIG. 2A is a schematic diagram illustrating an electronic device according to another embodiment of the invention, and FIG. 2B schematically illustrates a look-up table according to an embodiment of the invention. Referring to FIG. 2A and FIG. 2B, an integrated circuit 210 further includes a memory unit 201. The memory unit 201 stores a look-up table 202, and the look-up table 202 records a plurality of predetermined voltages VP1 to VP16 and a plurality of predetermined data DP1 to DP16. The integrated circuit 210 may compare the basis voltage with the predetermined voltages VP1 to VP16, so as to select one of the predetermined data DP1 to DP16 to serve as the trimming data D1. For example, when the basis voltage is 2.8112 V, the integrated circuit 210 may select the predetermined voltage VP2 that is substantially equal to the basis voltage according to a comparison result. For example, the integrated circuit 210 may select a predetermined voltage, which has the smallest difference in comparison with the basis voltage, from the predetermined voltages VP1 to VP16. Namely, a difference between the predetermined voltage selected by the integrated circuit 210 and the basis voltage may be 0V or within a tolerable range, for example. The integrated circuit 210 further sets the predetermined data DP2 corresponding to the predetermined voltage VP2 as the trimming data D1. In other words, the integrated circuit 210 looks up the look-up table 202 in the memory unit 201 according to the basis voltage to obtain the trimming data D1. Being similar to the embodiment illustrated in FIG. 1, the integrated circuit 210 may control the voltage generator 111 by using the trimming data D1, so as to calibrate the reference current IR1. Detailed operation of each element in the embodiment illustrated in FIG. 2A may refer to the embodiments above and will not be repeated hereinafter.

Figure 3A:
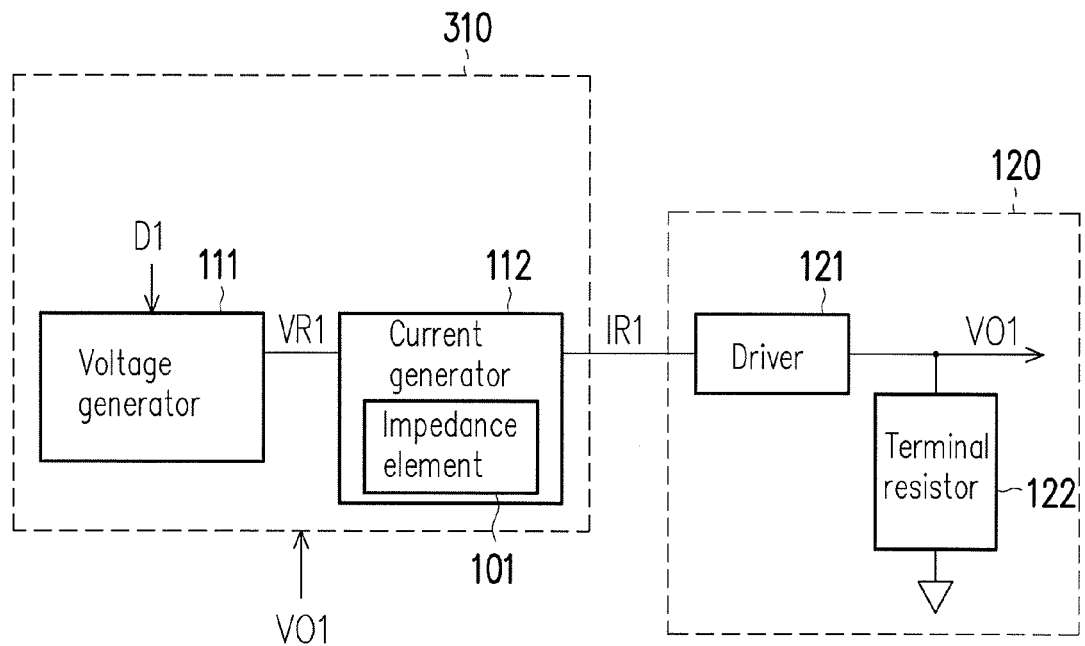
FIG. 3A is a schematic diagram illustrating an electronic device according to yet another embodiment of the invention.
Figure 3B:
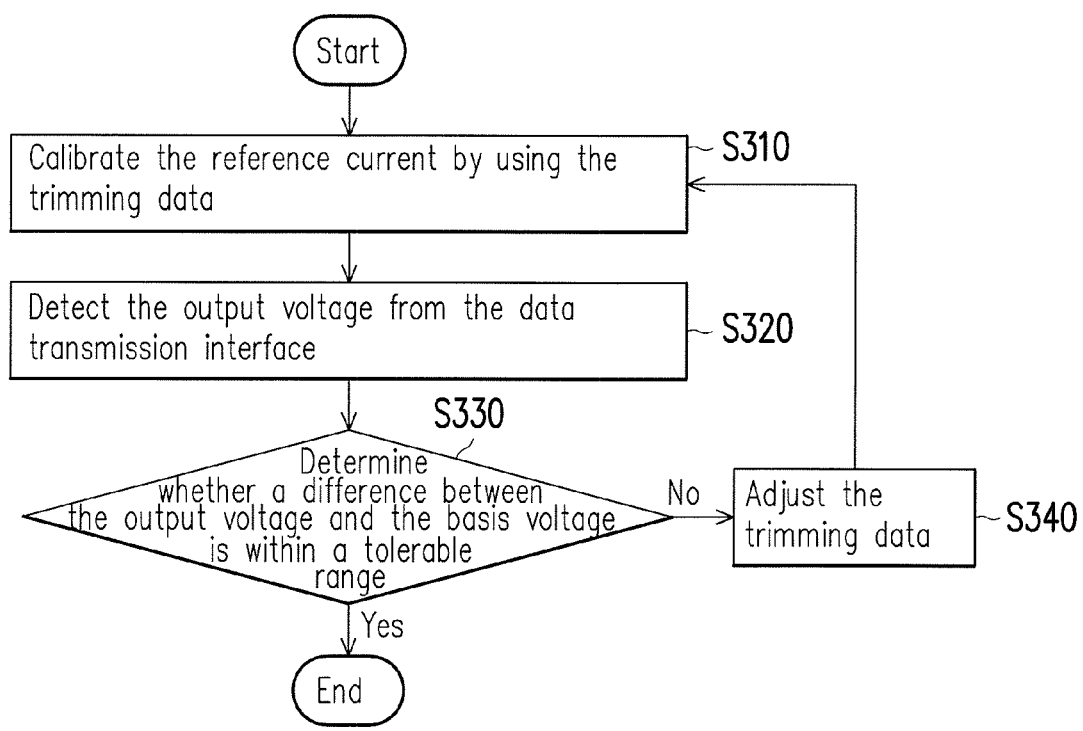
FIG. 3B is a flowchart illustrating calibration of the reference current according to an embodiment of the invention.

FIG. 3A is a schematic diagram illustrating an electronic device according to yet another embodiment of the invention. FIG. 3B is a flowchart illustrating calibration of the reference current according to an embodiment of the invention. In the embodiment illustrated in FIG. 3A, an integrated circuit 310 determines whether the reference current IR1 conforms to the required predetermined value according to the output voltage VO1 from the data transmission interface 120 and further adjusts the trimming data D1 according to a determination result.

In detailed operation, in step S310 of FIG. 3B, the integrated circuit 310 calibrates the reference current IR1 according to an initial value of the trimming data D1. For example, the integrated circuit 310 may control the voltage generator 111 according to the initial value of the trimming data D1 and thereby, provides the corresponding reference current IR1 to the data transmission interface 120. The data transmission interface 120 generates the corresponding output voltage VO1 based on the reference current IR1. Then, in step S320, the integrated circuit 310 detects the output voltage VO1 generated by the data transmission interface 120.

In step S330, the integrated circuit 310 compares the detected output voltage VO1 with the basis voltage. When the comparison result indicates that a difference between the output voltage VO1 and the basis voltage exceeds a tolerable range, it represents that the reference current IR1 deviates from the required predetermined value. Thus, in step S340, the integrated circuit 310 adjusts the trimming data D1. The integrated circuit 310 repeats steps S310 to S330, so as to calibrate the reference current IR1 again by using the adjusted trimming data D1 and detect the output voltage VO1 again to determine whether the trimming data D1 needs further adjustment. It is to be mentioned that in the process of adjusting the trimming data D1, the integrated circuit 310 may calculate a step amount of the correction (i.e., a unit correction amount) for the adjustment of the output voltage VO1 according to the detected output voltage VO1 and then, calculate a magnification factor required by the adjustment of the output voltage VO1 with the step amount of the correction as a base, so as to further adjust the trimming data D1 according to the magnification factor.

For instance, the integrated circuit 310 may first calibrate the reference current IR1 by using the trimming data D1 having a value of {0111} and accordingly, detect the output voltage VO1 having a level of 2.8801V. The integrated circuit 310 may calibrate again the reference current IR1 by using the trimming data D1 having a value of {1010} and accordingly, detect the output voltage VO1 having a level of 2.9171V. The integrated circuit 310 may calculate the step amount of the correction according to the two detected output voltages VO1, for instance, the calculated step amount of the correction is (2.9171−2.8801)/3=0.0123, and the integrated circuit 310 may calculate the magnification factor used to adjust the output voltage VO1 to the basis voltage (e.g., 2.8V) according to the step amount of the correction, for instance, the magnification factor calculated is (2.8−2.8801)/0.0123=−6. In this way, the integrated circuit 310 may add the calculated magnification factor {−6} with the trimming data D1 having the value {0111} to adjust the value of the trimming data D1 as {0001}.

On the other hand, when the comparison result indicates that the difference between the output voltage VO1 and the basis voltage is within the tolerable range, it represents that the reference current IR1 is calibrated to the required predetermined value. Namely, the integrated circuit 310 obtains the optimal trimming data D1. Thus, the integrated circuit 310 in this circumstance stops the adjustment of the trimming data D1 and continuously calibrates the reference current IR1 by using the optimal trimming data D1. In this way, the integrated circuit 310 may provide the PVT-independent reference current IR1 to the data transmission interface 120. Detailed operation of each element in the embodiment illustrated in FIG. 3A may refer to the embodiments above and will not be repeated hereinafter.

It is to be mentioned that the integrated circuits 110, 210 and 310 in the embodiments respectively illustrated in FIG. 1, FIG. 2A and FIG. 3A control the voltage generator 111 by using the trimming data D1, so as to calibrate the reference current IR1. However, in another embodiment, the integrated circuits 110, 210 and 310 may also control the current generator 112 by using the trimming data D1, such that the current generator 112 adjusts the reference current IR1 according to the trimming data D1 to achieve the calibration of the reference current IR1.

Figure 4:
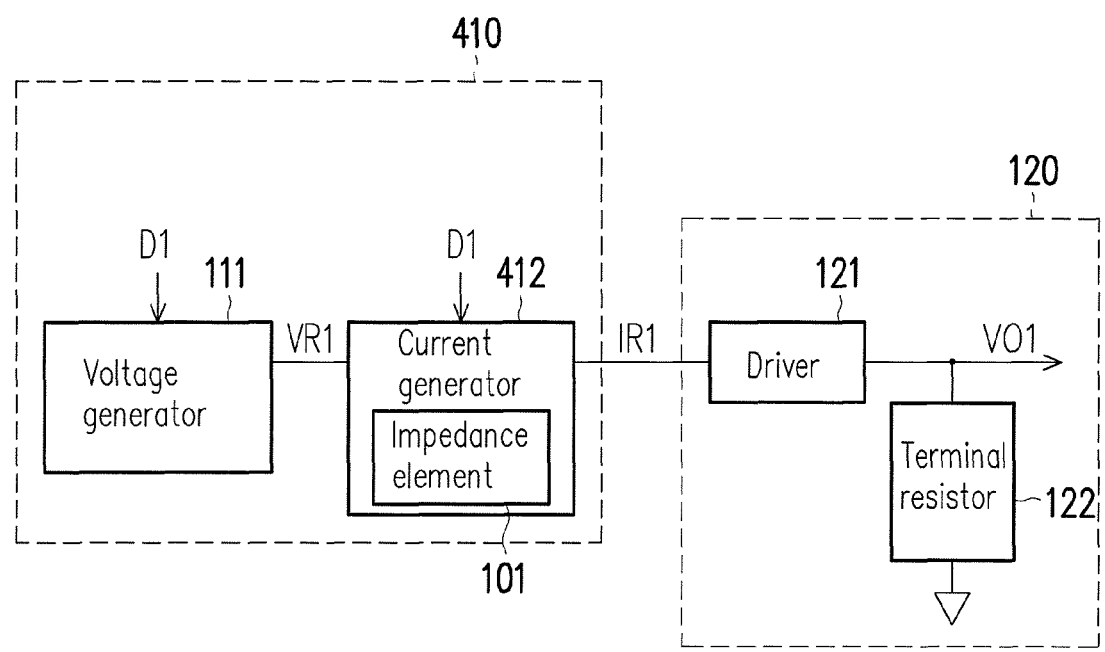
FIG. 4 is a schematic diagram illustrating an electronic device according to still another embodiment of the invention.

Likewise, in another embodiment, the integrated circuits 110, 210 and 310 may also control the voltage generator 111 and the current generator 112 simultaneously by using the trimming data D1, so as to calibrate the reference current IR1. For instance, FIG. 4 is a schematic diagram illustrating an electronic device according to still another embodiment of the invention. FIG. 4 illustrates an electronic device 40 that is similar to the electronic device 10 illustrated in FIG. 1. The main difference between the embodiments of FIG. 4 and FIG. 1 is, an integrated circuit 410 in FIG. 4 controls the voltage generator 111 and the current generator 412 by using the trimming data D1, such that the voltage generator 111 adjusts the reference voltage VR1 according to the trimming data D1, and the current generator 412 adjusts the reference current IR1 according to the trimming data D1. In other words, the integrated circuit 410 utilizes the trimming data D1 to adjust the reference voltage VR1 and adjust the reference current IR1 simultaneously, so as to calibrate the reference current IR1. Detailed operation of each element in the embodiment illustrated in FIG. 4 may refer to the embodiments above and will not be repeated hereinafter.

Figure 5:
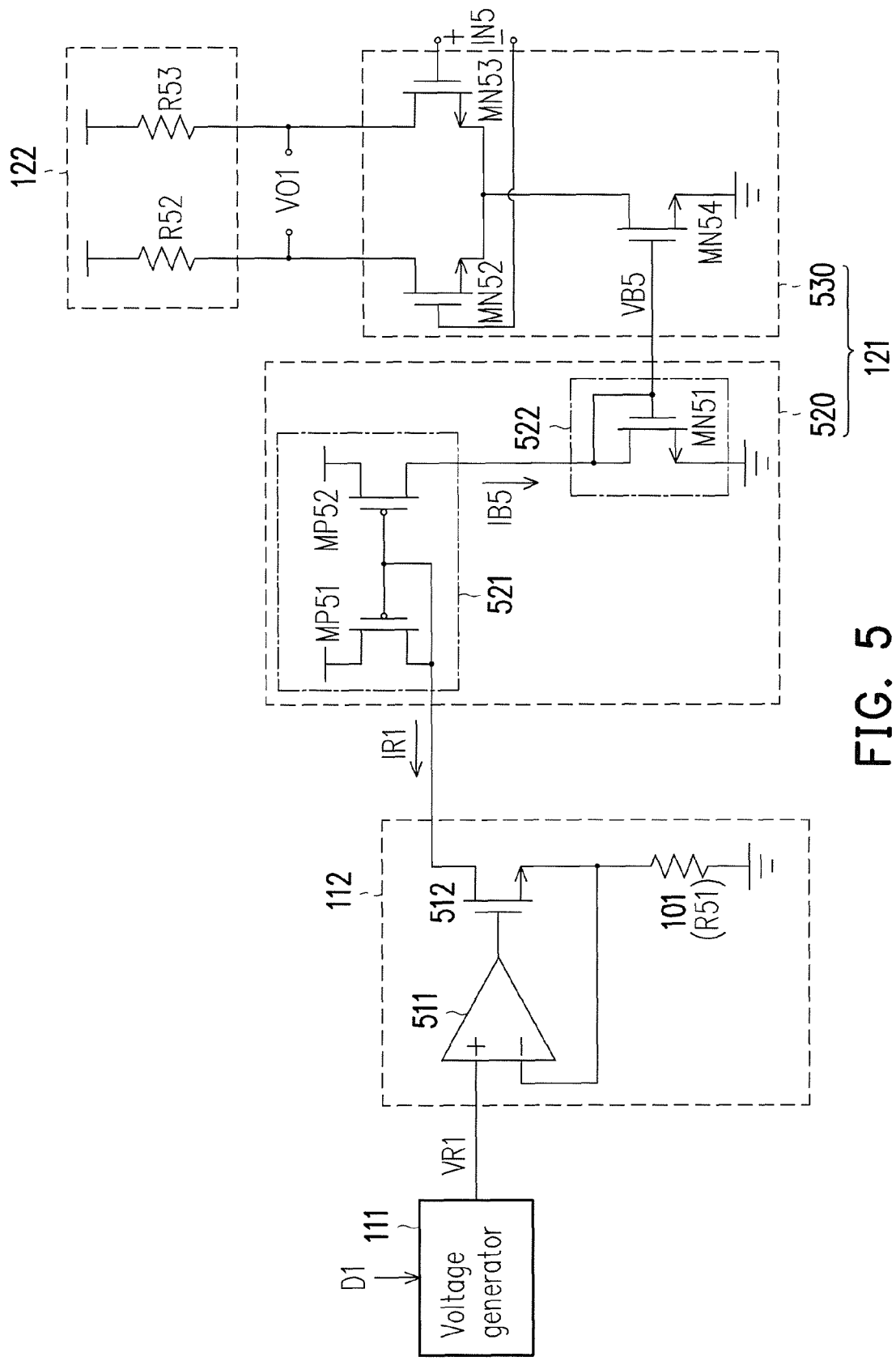
FIG. 5 is a schematic circuit diagram illustrating an electronic device according to still another embodiment of the invention.

In order to make the invention more comprehensible to persons with ordinary skill of the art, FIG. 5 is a schematic circuit diagram illustrating an electronic device according to still another embodiment of the invention. Descriptions with respect to the detailed structures of the current generator 112 and the driver 121 will be further set forth with reference to FIG. 5.

Referring to FIG. 5, in an embodiment, the current generator 112 includes the impedance element with the positive temperature coefficient 101, an operational amplifier 511 and a transistor 512. A non-inverting input terminal of the operational amplifier 511 receives the reference voltage VR1, and an inverting input terminal of the operational amplifier 511 is coupled to the ground through the impedance element 101. A control terminal of the transistor 512 is coupled to an output terminal of the operational amplifier 511, a first terminal of the transistor 512 is coupled to the driver 121, and a second terminal of the transistor 512 is coupled to the impedance element 101. In an embodiment, the impedance element 101 is a resistor R51. In operation, the impedance element 101, the operational amplifier 511 and the transistor 512 may form a feedback loop, so as to generate the reference current IR1. The current value of the reference current IR1 is equal to the reference voltage VR1 divided by a resistance value of the resistor R51. Both the reference voltage VR1 and the resistance value of the resistor R51 rise along with temperature rise, and thus, the reference current IR1 does not change with the temperature and the voltage variations.

The driver 121 includes a bias circuit 520 and a driving circuit 530. The bias circuit 520 is coupled to the current generator 112 and generates a bias voltage VB5 in response to the reference current IR1. For instance, the bias circuit 520 includes a current mirror 521 and a load element 522. The current mirror 521 is composed of a P-type transistor MP51 and a P-type transistor MP52, and the load element 522 is formed by a diode-connected N-type transistor MN51. The current mirror 521 is coupled to the current generator 112 to receive the reference current IR1 and generates a bias current IB5 based on the reference current IR1. For example, the current mirror 521 may amplify the reference current IR1 and copy the amplified reference current IR1 to the load element 522 to form the bias current IB5. Additionally, the load element 522 is coupled to the current mirror 521 and generates the bias voltage VB5 based on the bias current IB5.

The driving circuit 530 is coupled to the bias circuit 520 and the terminal resistor 122. The driving circuit 530 generates a driving current flowing through the terminal resistor 122 according to the bias voltage VB5 and a differential input signal IN5, such that the terminal resistor 122 generates the output voltage VO1 according to the driving current. For instance, the driving circuit 530 includes N-type transistors MN52 to MN54. The terminal resistor 122 includes resistors R52 and R53, a terminal of the resistors R52 and R53 receives the power voltage. In operation, the N-type transistors MN52 and MN53 may form a differential pair to receive the differential input signal IN5. The N-type transistor MN53 may form a current source controlled by the bias voltage VB5 to provide a current to the differential pair. Additionally, the differential pair formed by the N-type transistors MN52 and MN53 controls the driving current flowing through the resistors R52 and R53 according to the differential input signal IN5, such that the other terminal of the resistors R52 and R53 generates the corresponding output voltage VO1.

In light of the foregoing, the current generator of the integrated circuit of the invention generates a current based on a predetermined voltage value. A level of the current neither changes with the temperature change nor drifts with the voltage variation. Thereby, the integrated circuit can generate the stable reference current without the need to be equipped with any bandgap reference circuit or be connected with an external resistor through an additional pin. In this way, the layout area of the integrated circuit of the invention can be effectively reduced, which can contribute to the development of miniaturization of the electronic device. The invention can also contribute to preventing the integrated circuit from the influence caused by the external noise, so as to improve the stability of the reference current.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An integrated circuit, comprising:
a voltage generator, generating a reference voltage proportional to an absolute temperature based on a predetermined value; and
a current generator with a negative temperature coefficient, receiving the reference voltage and comprising an impedance element with a positive temperature coefficient, the current generator generating a reference current, which is independent of temperature, based on the impedance element and the reference voltage between two ends of the impedance element, wherein a data transmission interface is connected to the current generator and generates an output voltage by using the reference current from the current generator, the integrated circuit receives the output voltage and adjusts trimming data according to the output voltage, and the voltage generator adjusts the reference voltage according to the trimming data to calibrate the reference current.

2. The integrated circuit according to claim 1, wherein the integrated circuit further comprises a memory unit, and the integrated circuit looks up a look-up table in the memory unit according to a basis voltage to obtain the trimming data.

3. The integrated circuit according to claim 1, wherein the output voltage of the data transmission interface is adjusted to a basis voltage in response to the adjustment of the trimming data.

4. The integrated circuit according to claim 1, wherein the current generator adjusts the reference current according to the trimming data.

5. The integrated circuit according to claim 1, wherein the current generator further comprises:
an operational amplifier, having a non-inverting input terminal receiving the reference voltage and an inverting input terminal coupled to an impedance element; and
a transistor, having a control terminal coupled to an output terminal of the operational amplifier, a first terminal, and a second terminal coupled to the impedance element, wherein the current generator provides the reference current through the first terminal of the transistor.

6. The integrated circuit according to claim 5, wherein the impedance element is a resistor, a first terminal of the resistor is coupled to the inverting input terminal of the operational amplifier and the second terminal of the transistor, and a second terminal of the resistor is coupled to a ground.

7. An electronic device, comprising:
an integrated circuit, comprising:
a voltage generator, generating a reference voltage proportional to an absolute temperature; and
a current generator with a negative temperature coefficient, receiving the reference voltage and comprising an impedance element with a positive temperature coefficient, the current generator generating a reference current, which is independent of temperature, based on the impedance element and the reference voltage between two ends of the impedance element; and
a data transmission interface, connected to the current generator and generating an output voltage by using the reference current from the current generator, wherein the integrated circuit receives the output voltage, the integrated circuit adjusts trimming data according to the output voltage and calibrates the reference current by using the adjusted trimming data, and the output voltage of the data transmission interface is adjusted to a basis voltage in response to calibration of the reference current.

8. The electronic device according to claim 7, wherein the integrated circuit further comprises a memory unit, and the integrated circuit looks up a look-up table in the memory unit according to the basis voltage to obtain the trimming data.

9. The electronic device according to claim 7, wherein the integrated circuit detects the output voltage.

10. The electronic device according to claim 7, wherein the integrated circuit controls the voltage generator or the current generator by using the trimming data, such that the voltage generator adjusts the reference voltage according to the trimming data, or the current generator adjusts the reference current according to the trimming data.

11. The electronic device according to claim 7, wherein the integrated circuit controls the voltage generator and the current generator by using the trimming data, such that the voltage generator adjusts the reference voltage according to the trimming data, and the current generator adjusts the reference current according to the trimming data.

12. The electronic device according to claim 7, wherein the current generator further comprises:
an operational amplifier, having a non-inverting input terminal receiving the reference voltage and an inverting input terminal coupled to an impedance element; and
a transistor, having a control terminal coupled to an output terminal of the operational amplifier, a first terminal through, and a second terminal coupled to the impedance element, wherein the current generator provides the reference current through the first terminal of the transistor.

13. The electronic device according to claim 12, wherein the impedance element is a resistor, a first terminal of the resistor is coupled to the inverting input terminal of the operational amplifier and the second terminal of the transistor, and a second terminal of the resistor is coupled to a ground.

14. The electronic device according to claim 7, wherein the data transmission interface comprises:
a driver, coupled to the current generator and generating a driving current in response to the reference current and a differential input signal; and
a terminal resistor, coupled to the driver and generating the output voltage according to the driving current.

15. The electronic device according to claim 14, wherein the driver comprises:
a bias circuit, coupled to the current generator and generating a bias voltage in response to the reference current; and
a driving circuit, coupled to the bias circuit and the terminal resistor and generating the driving current according to the bias voltage and the differential input signal.

16. The electronic device according to claim 15, wherein the bias circuit comprises:
   a current mirror, coupled to the current generator to receive the reference current and generating a bias current based on the reference current; and
   a load element, coupled to the current mirror and generating the bias voltage based on the bias current.

* * * * *